United States Patent [19]

Morgan

[11] 4,338,581

[45] Jul. 6, 1982

[54] ROOM ACOUSTICS SIMULATOR

[75] Inventor: Nelson H. Morgan, Novato, Calif.

[73] Assignee: The Regents of the University of California, Berkeley, Calif.

[21] Appl. No.: 146,966

[22] Filed: May 5, 1980

[51] Int. Cl.$^3$ ...................... H03H 15/02; G10H 1/00
[52] U.S. Cl. .................................... 333/165; 84/1.24; 84/DIG. 26; 179/1J; 333/166
[58] Field of Search ................ 333/166, 165, 138–140; 84/1.24, 1.25, DIG. 9, DIG. 26, DIG. 10; 179/1 J, 1 M

[56] References Cited

U.S. PATENT DOCUMENTS 3,110,771 11/1963 Logan, Jr. et al. ................... 179/1 J
4,063,034 12/1977 Peters .................................... 179/1 J
4,181,820 1/1980 Blesser et al. ........................ 179/1 J
4,244,262 1/1981 Imai ................................ 333/165 X

FOREIGN PATENT DOCUMENTS 7802114 8/1979 Netherlands ......................... 84/1.24

Primary Examiner—Marvin L. Nussbaum

Attorney, Agent, or Firm—Townsend and Townsend

[57] ABSTRACT

Room acoustics simulation is achieved by digitally defining delay and weighting parameters and generating sampled analog signal responses. In the early portion of a response term an accurate impulse response is provided and subsequently high echo density is simulated using sampled analog signal Schroeder sections. A sampled data analog signal device is used which employs charge transfer devices as programmable delay media, multiplying digital to analog converters to generate weighting of the analog signal and a general purpose microprocessor as a parameter calculator. The early impulse response characteristic is accomplished by providing a time domain finite impulse response (FIR) section in a transversal filter arrangement which directly feeds to an ultimate output and to parallel comb filter sections which in turn input to at least one all pass section of the so-called Schroeder configuration. The charge transfer devices are employed as programmable delays to propagate the analog signals. All weighting coefficient products are generated by multiplying digital-to-analog converters.

12 Claims, 5 Drawing Figures

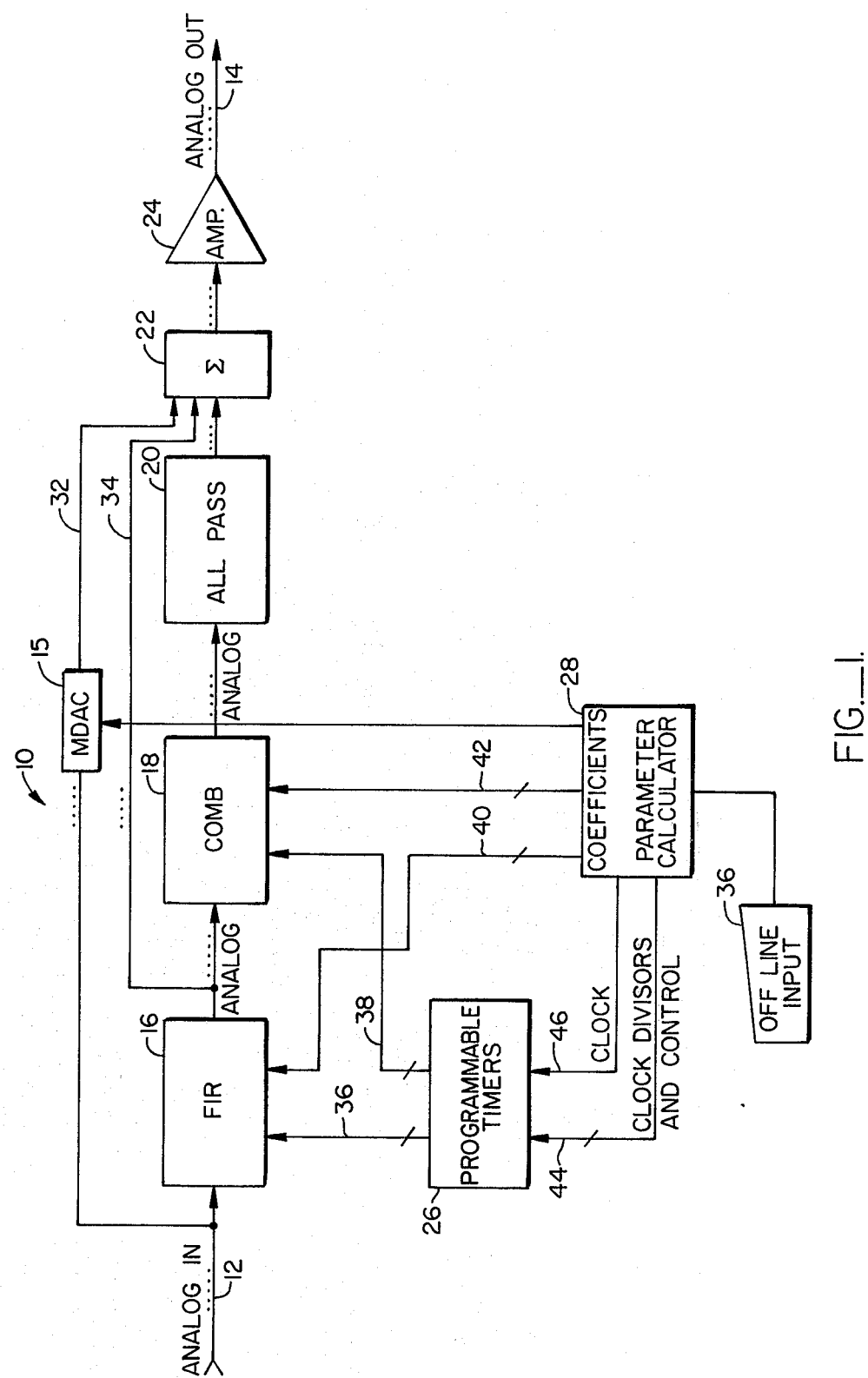
FIG._1.

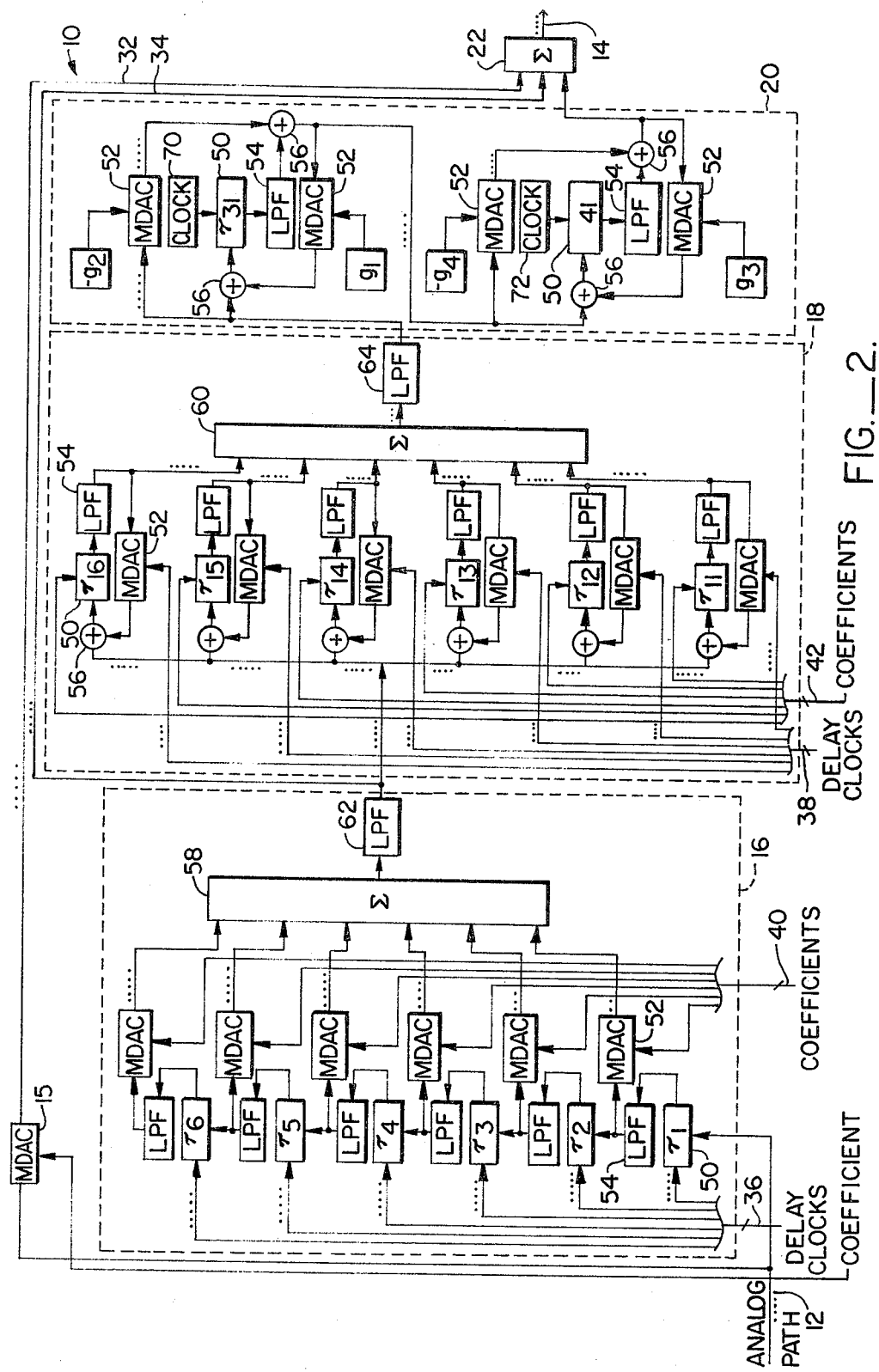
FIG._2.

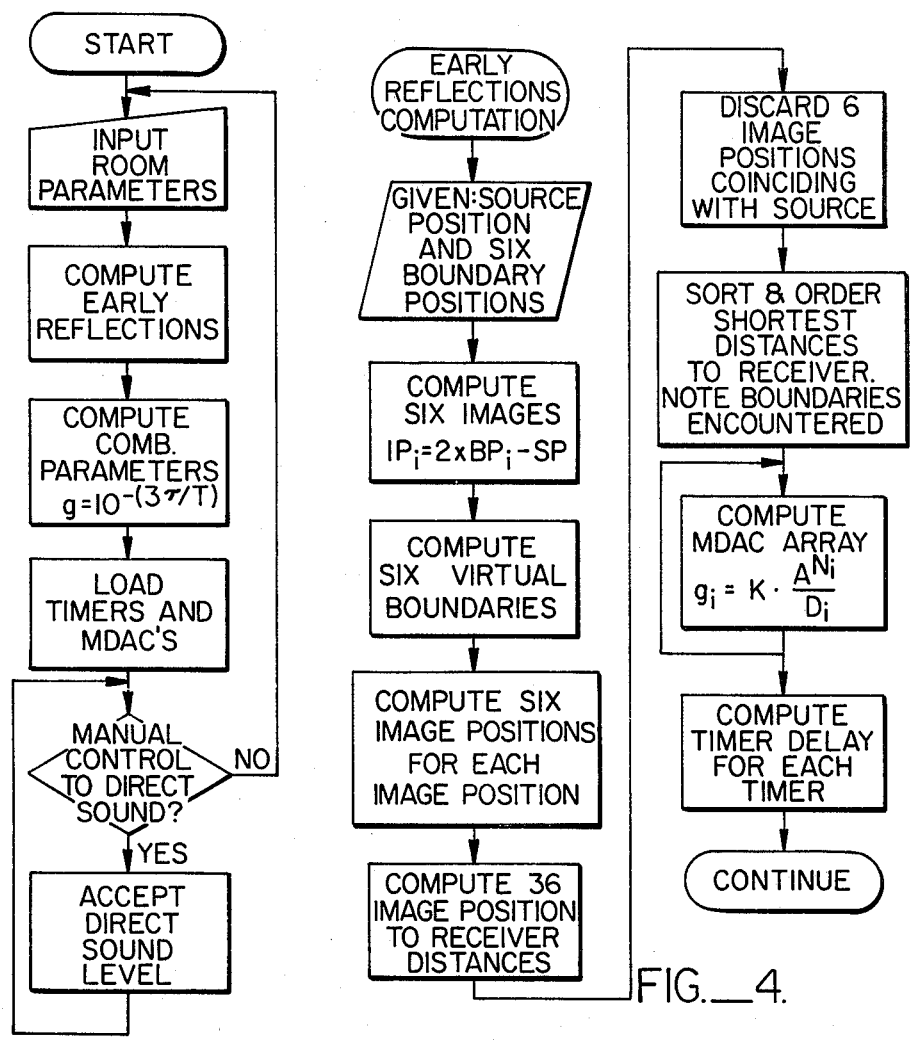
FIG._3.  FIG._4.
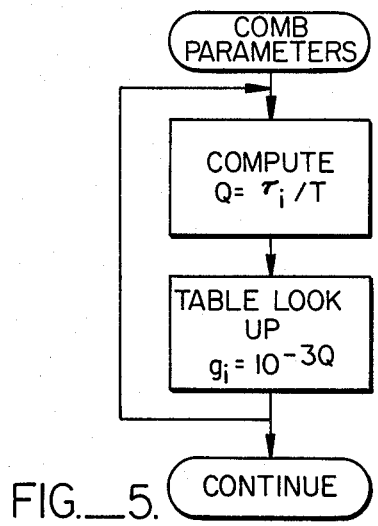
FIG._5.

ROOM ACOUSTICS SIMULATOR

BACKGROUND OF THE INVENTION

The Government has rights in this invention pursuant to Grant No. 21798 awarded by the National Science Foundation.

1. Field of Invention

This invention relates to electronic reverberation in which analog time domain signal processing employs digital parametric control. In particular, this invention relates to methods and apparatus for simulating room acoustics by specular modeling.

In recording and film studio applications, an audio technician frequently attempts to synthesize an apparent recorded room environment in an unreverberant studio recording. In the past, mechanisms to perform such synthesis have consisted of either electromechanical devices or more recently expensive digital electronic reverberators. These mechanisms have in many cases been inadequate and unsatisfactory. Electromechanical devices are typically characterized by lack of flexibility. Typically only the wideband decay time is adjustable on electromechanical devices.

Digital devices promise greater inherent flexibility due in part to the potential for easy programmability. However, physical modeling of room enclosures is cumbersome, difficult and often inaccurate. Moreover, the expense of highly accurate mechanical parts and/or high-speed sophisticated electronic components makes the cost of these devices prohibitive.

What is needed is a relatively low-cost implementation of a room acoustic simulator which preserves flexibility and achieves high accuracy.

2. Description of the Prior Art

In the past twenty years, time domain electronic solutions have been suggested to model acoustic delays of natural echos. Pioneering work was carried out by M. R. Schroeder at Bell Telephone Laboratories. In particular, in the *Journal of the Audio Engineering Society*, Vol. 10, p. 219 (July 1962), Schroeder proposed requirements for high quality artificial reverberations, namely, an accurate amplitude-frequency transfer function, or so-called flat response, and a high echo density (i.e., a high number of output echo pulses per second in response to a single input pulse).

Schroeder proposed an algorithmic solution comprising parallel-coupled time domain comb filters coupled in series with an all-pass network and added to an undelayed representation of the original signal. The result proposed was an infinite impulse response filter. Such reverberation networks have come to be known as Schroeder configurations.

Recently, the inventor and others have independently suggested a modified technique for simulating room acoustics in a manner enhancing the significant aspects of the Schroeder technique. The improvement comprises the substitution of accurate impulse response information for high echo density information in the early interval of the response term. The inventor in "Room Acoustics Simulation Using Discrete-Time Methods," Master's Thesis, University of California, April 1979, and James A. Moorer, in "About this Reverberation Business," *Computer Music Journal*, Vol. 3, No. 2, Issue 10, pp. 13–28, have independently proposed the use of transversal filter structures preceding Schroeder sections as a means for adding the early impulse response information. Thus, it has been proposed that the artificial reverberation criteria are first, accurate early impulse response, and second, high echo density only in the subsequent interval of the impulse response term.

Full discrete-time implementations of the transversal filter solution are nevertheless cumbersome. For example, the convolution of a preselected impulse response with an arbitrary input signal requires substantial computational power and speed. Such an approach has not been considered practical. A fully digital technique is precluded by expense and state of the art device limitations for implementation in all but the simplest forms. Laboratory demonstration devices which are fully programmable are not useful in real-time applications because of speed limitations. Available commercial devices are not user programmable, except in the grossest sense, and generally comprise complex special-purpose digital structures with a consequence that the embodiments are prohibitively expensive and inflexible.

What is therefore needed is an artificial reverberation device which provides reasonably accurate reverberation modeling while achieving maximum parametric flexibility for a reasonable expense.

SUMMARY OF THE INVENTION

According to the invention, reasonably accurate room acoustics simulation is achieved by digitally defining delay and weighting parameters and generating sampled analog signal responses. In the early portion of a response term an accurate impulse response is provided and subsequently high echo density is simulated using sampled analog signal Schroeder sections. A sampled data analog signal device is used which employs charge transfer devices as programmable delay media, multiplying digital to analog converters to generate weighting of the analog signal and a general purpose microprocessor as a parameter calculator. The early impulse response characteristic is accomplished by providing a time domain finite impulse response (FIR) section in a transversal filter arrangement which directly feeds to an ultimate output and to parallel comb filter sections which in turn input to at least one all pass section of the so-called Schroeder configuration. The charge transfer devices are employed as programmable delays to propagate the analog signals. All weighting coefficient products are generated by multiplying digital-to-analog converters.

The parametric values for delay timing and weighting are digitally generated by a microprocessor which is preferably preprogrammed with a room enclosure modeling algorithm. In the computation system, the room enclosure is presumed to be specular with respect to a point sound source.

An advantage of the invention is the ability to model a room enclosure with reasonable accuracy merely by providing the dimensions of the room and the locations of the sound source and the sound receiver.

A further advantage of the invention is the ability to directly program delays and amplitudes of early impulse reflections.

A still further advantage of the invention is its relatively low-cost implementation with available technology.

Other objects and advantages of the invention will be apparent upon reference to the following detailed description taken in connection with the accompanying drawings.

BRIEF DESCRIPTION OF THE DRAWINGS

FIG. 1 is a block diagram of a room acoustics simulator according to the invention.

FIG. 2 is a block diagram of a specific embodiment of one aspect of the invention.

FIG. 3 is a flow chart of the method for preselecting coefficients and delays according to the invention.

FIG. 4 is a flow chart of the method for computation of early reflections parameters.

FIG. 5 is a flow chart of the method for computation of comb section parameters.

DETAILED DESCRIPTION OF PREFERRED EMBODIMENTS

FIG. 1 depicts a block diagram of an electronic reverberator 10 for a single channel. The reverberator 10 according to the invention is characterized by analog signal processing under relatively simple and inexpensive digital signal control. Specifically, there is provided an analog signal input 12 and an analog signal output 14. An undelayed analog signal path 32 is provided between analog signal input 12 and the analog signal output 14 through a summer 22 and an amplifier 24. The undelayed signal path corresponds to a direct sound level signal path. Level control of the direct signal may be provided in a further path (not shown) or in the direct signal path 32. For this purpose a Multiplying Digital-to-Analog Converter (MDAC) 15 may be provided in the direct signal path 32.

According to the invention, an analog signal input is provided through a finite impulse response network (FIR) 16 having an analog signal path but which is under digital parametric control, the output of which is coupled to an analog signal path Schroeder-type reverberator configuration, also under digital parametric control, as hereinafter explained. It should be understood that the FIR 16 is a sampled data, or discrete time, finite impulse response signal processing means having an analog input, an analog signal output, and an analog signal path means coupling the analog signal input to the analog signal output, and further includes delay means and analog gain weighting means.

The Schroeder configuration comprises a comb filter signal processing means or simply comb 18 coupled to an all pass signal processing means or all pass section 20 with an analog signal path 34 coupled between the output of the FIR 16 and a summer 22 to which is also coupled the analog output of all pass section 20.

The comb 18 has an analog signal input, an analog signal output, an analog signal means coupling the analog signal input to the analog signal output and digital signal input means operative to regulate analog signal delay functions and analog gain weighting functions of the analog signal means.

The all pass section 20 has an analog signal input, an analog signal output, an analog signal means coupling the analog signal input to the analog signal output and preferably preset analog signal delay functions and analog gain weighting functions operative to control the analog signal means.

The reverberator 10 further includes a parameter calculator 28 having an off line input means and digital signal output means, specifically a digital signal bus 40 coupled to the FIR 16 which is operative to convey digital representations of analog gain weighting coefficients to the digital signal input means of the FIR 16, a digital signal bus 42 coupled to the comb 18 and operative to convey the gain weighting coefficients of the digital signal input means of the comb 18, a coupling to an MDAC 15 and a bus 44 and clock line 46 coupled to programmable timer means 26.

Programmable timer means 26 is operative to receive clock divisors via bus 44 for a selected number of clocks and to convey clock signals via buses 36 and 38 to respective clock inputs of the digital signal input means of the FIR 16 and the comb 18. The clock signals are operative in synchronism with a master clock signal provided via clock line 46. The exact operation of the reverberator 10 will be apparent upon detailed consideration of a specific embodiment as set forth in FIG. 2.

FIG. 2 is a specific embodiment setting out the FIR 16, the comb section 18 and the all pass section 20. The specific embodiment shown provides for six elements of delay. More or fewer elements of delay may be included without departing from the spirit of the invention. Generally fewer elements of delay will increase the level of approximation of actual acoustic reverberation, an increased number of delays will elevate the level of complexity and expense of the circuit without substantially improving the psychoacoustic result.

By way of summary, the FIR 16 comprises an analog transversal structure employing digitally programmable analog signal delay lines 50, such as charge transfer devices, coupled through analog signal smoothing means, i.e., low pass filters 54, an analog signal weighting means 52 embodied in multiplying digital-to-analog converters (MDACs) wherein weighting coefficients are digitally preselected, a summer 58, and an output low pass filter 62.

The comb 18 is an array of parallel coupled comb filter elements, each having digitally programmable analog signal delay lines 50, such as charge transfer devices, a summer 56, and a digitally programmable analog signal weighting means 52 in feedback relationship with the signal delay device 50. According to the invention, the gain weighting means is an MDAC.

Further according to the invention, the all pass section 20 comprises a plurality of analog signal all pass units coupled in series with one another, each having analog signal delay lines 50 and a pair of analog signal weighting means 52 in feedback and feed forward relationship with the delay line 50. The weighting means and delay lines 50 are typically preset and have no need of programmability. Nevertheless, the weighting means may be MDACs.

Programming in its simplest form is merely the setting of the switches of programmable timers 26 and of the MDACs of the FIR 16 and comb 18. However, it is more convenient and preferable that the digital programming be provided off-line via digital signal level lines 36, 38, 40 and 42 from programmable timers 26 (FIG. 1) and the parameter calculator 28 (FIG. 1), wherein the parameter calculator 28 computes all delays and gain weighting coefficients according to preset formulae.

The parameter calculator 28 is conveniently a low-cost and relatively low speed general purpose microprocessor. The output terminals of the general purpose microprocessor need only be digital signal levels in the form of bytes of data which are loaded to the digitally programmable delay lines and weighting means. One of the principal advantages of the invention is the elimination of the need for high-speed digital signal processing capabilities or of a dedicated high-speed special purpose digital processor.

The function of the parameter calculator 28 is primarily to convert user-specified parameters to preset switch states for programmable timers 26 and weighting means 52 in the otherwise analog signal processing device. For this purpose, the parameter calculator 28 is programmed to perform calculations according to the flow charts set forth in FIGS. 3, 4 and 5.

Specifically, the programmable calculator computes delays and weighting coefficients according to a simplified version of the specular simulation technique outlined by J. Allen, "Method for Simulating Small Room Acoustics," *The Journal of the Acoustic Society of America*, Vol. 65, No. 4 (April 1979).

Adapting the Allen technique to a specific application, referring to FIG. 3, a user inputs the room parameters, the calculator 28 computes the early reflections and then computes the comb parameters according to known formulae with the assumption of exponential decay, and then the calculator loads the timers and the MDACs with appropriate bytes of digital information. Finally, the parameter calculator 28, exercising an optional control function may determine whether the reverberator is to accept direct sound level control from a real-time manual input. If not, the control of the calculator 28 is returned to a condition where it can accept further room parameter inputs.

Turning now to FIG. 4, a flow chart is shown which illustrates how the early reflections are computed for generating the coefficients and timing of the FIR 16. The manually input room parameters are the source position, the receiver position and the three room dimensions. Using these parameters, six images are computed based on the formula $IP_i = 2 \times BP_i - SP$, for a single dimension, where IP is the image position, BP is the boundary position, SP is the source position and i is an index. This formula is the basic computation for specular reflection. The use of this formula for a relatively small number of reflections is justified since reflections from a small number of bounces can be assumed to arrive at a receiver prior to reflections from a large number of bounces.

Having computed the six images positions, six virtual boundaries are computed. The virtual boundaries correspond to an "unfolded" enclosure. For each of the six computed image positions, there will be six further image positions. Therefore, six image positions are computed for each image. After the thirty-six image positions are computed, the thirty-six image position to receiver distances are computed. This computation is carried out using a successive approximation square root algorithm employing a multiply instruction. This technique simplifies the software requirements of the parameter calculator.

Since six of the image positions and distances will coincide with the source, those six image positions are discarded. Thereafter, the shortest distances between the receiver and the image positions are determined through sorting. In each case, the number of boundaries encountered by the shortest distance images is noted for determination of the appropriate reflection coefficient value. The array of values for loading the gain weighting devices can now be computed. This is the MDAC array. The computation is carried out as follows according to the formula $$g_i = K \cdot A^{N_i} / D_i$$

where A is the reflection coefficient with a value between 0–1, D is the image position to receiver distance, K is the constant determined by the hardware, N is the number of reflections, i is the index, and g is the weighting coefficient. It will be noted that free field attenuation follows the inverse square law for energy. Since the weighting corresponds to sound pressure, the inverse square law for energy dictates a linear attenuation with distance.

The delay for each timer is then computed by taking into account the distance and the speed of sound. The delay for each distance is simply a multiple of the master clock period.

Turning to FIG. 5, the computation is shown for the determination of the comb weighting function parameters. The computation involves the calculation of $Q = \tau_i / T$, where T is the reverberation time at 60 db attentuation of the original sound. This computation may be carried out by a table look-up of a reciprocal in conjunction with a multiplication function thereby eliminating the need for a divide function in the parameter calculator. The weighting parameters are then calculated by a table look-up technique which gives the value for the formula $g_i = 10^{-3Q}$, where Q is the variable previously computed. The relatively small number of possible values for g simplifies the computation and suggests the use of a table look-up technique rather than direct computation.

Returning now to FIG. 2, the specific embodiment is now examined in some detail. The FIR 16, the comb 18 and the all pass section 20 each comprise four types of elements, namely, a programmable discrete time analog signal delay line 50, a multiplying digital-to-analog converter (MDAC) 52, an analog low pass filter and an analog summer.

The analog delay line 50 is preferably a charge transfer device such as one of the SAD series n-channel bucket brigade audio delay lines manufactured by EG & G Reticon of Sunnyvale, Calif. Each delay line 50 has a plurality of elements capable of clock controlled variable delays yielding a total of up to about 250 milliseconds and preferably up to about 100 milliseconds. Delay is controlled by an input clock at a preselected clock rate.

Low pass filters 54 are associated with each delay line 50 to aid in recovery of the signal waveform. Low pass filtering is necessary because the delay lines are clocked at different rates, which gives rise to discontinuities in signal propagation.

The MDAC 52 is preferably a type AD7524 8-bit monolithic CMOS multiplying digital-to-analog converter made by Analog Devices of Norwood, Mass. As a multiplying DAC the MDAC 52 accepts a variable analog voltage signal at a reference voltage input and generates an analog output signal which is proportional to the product of the analog input voltage and a digital value at digital inputs. The MDAC 52 is well-suited for direct interface with a microprocessor which is intended to control parameters such as weighting coefficients. Summers 56 are conveniently summing junctions of operational amplifiers (not shown), which are incorporated into buffers or filters in the device. In addition, the output of the FIR 16, the comb 18 and the all pass section 20 are provided through multiple input summers 58, 60 and 22, respectively. Summer 22 receives the direct signal via line 32 and the FIR output signal via line 34 as well as the all pass output signal. Careful filtering of the summed output of the FIR filter 16 and the comb 18 are important to signal recovery. Therefore, the output of summer 58 is directed through a sharp cutoff low pass filter 62, such as a third order Butterworth filter having a rolloff at 6 kHz. Similarly, the output of summer 60 is directed through a sharp cutoff low pass filter 64.

The weighting coefficient and the clocks of the all pass section 20 are preferably preselected for simplicity. The all pass section 20 which may comprise two segments coupled in series has first weighting coefficients $g_1$, $g_3$ of each segment selected to be the negative of the second weighting coefficients $g_2$, $g_4$. Clocks 70 and 72 drive the delay elements 50 of the all pass section 20. The clocks 70 and 72 may be fixed frequency oscillators, such as voltage controlled oscillators with the reference voltage set at a preselected level.

The programmable timers 26 (FIG. 1), which are used to clock the programmable delay lines 50, are preferably a plurality of programmable timers such as AMI6840 programmable timers made by American Micro Systems, Inc. of Santa Clara, Calif. Each timer unit has the capability of generating three clocks in response to a master clock after 3 digital bytes have been sequentially applied at digital input terminals.

In order to more fully understand the invention, a brief explanation of operation is instructive. Referring to FIG. 1, an operator inputs room dimension parameters to the parameter calculator 28 through the off-line input device 30. The parameter calculator 28 then computes the reflection times and the weighting coefficients for the FIR 16 and the comb 18 and loads the programmable timers 26 and the MDACs 52 (FIG. 2) with the digital bytes of information specifying the parameters of operation of the reverberator 10.

The analog functions of the reverberator 10 may then be activated. An analog signal is applied at the analog input 12 to the FIR 16 and to the summer 22. The direct signal is applied via signal path 32 and preferably through an MDAC 15, amplified at amplifier 24 and then fed, undelayed, to analog output 14. The FIR 16 processes the analog input signal through its six delays 50, extracting the first six reflections and applying them serially with appropriate weighting coefficients generated by the MDACs 52 to the summer 58. After low pass filtering 62, the output of the FIR 16 is applied as delayed via signal path 34 to the summer 22 such that the first reflections follow directly after the direct signal.

The output of the FIR 16 is also applied to the comb 18 the output of which is applied to the all pass section 20, where high echo density transients are generated in accordance with the principles established by Schroeder. In particular, the comb network produces a decaying repeated echo with an amplitude-frequency response which has the appearance of a comb with periodic maxima and minima. The resultant signal is fed through summer 60 and low pass filter 64 to all pass section 20. The all pass reverberator produces a densified representation of the input energy while having a substantially flat frequency transfer function. The output signal is fed to the summer 62 as a delayed high echo density representation of the analog input signal.

The invention herein described is a cost-effective hardware approach using an analog sampled data signal path with digitally controlled circuit elements. The circuit elements may be digitally controlled by a general purpose microprocessor enabling easy user interface. Listener tests of the operation of the invention verify that the results are subjectively indistinguishable from the reverberation of real rooms and halls to the extent they can be simulated with simple modeling techniques.

The invention has now been described with reference to specific embodiments. Other embodiments will be apparent to those of ordinary skill in the art. For example, the direct signal rather than the FIR output signal may be applied at the input of the comb 18. It is therefore not intended that the invention be limited except as indicated by the appended claims.

What is claimed is:

1. An apparatus for generating an electronic simulation of acoustic reverberation comprising:

a sampled time finite impulse response signal processing means having an analog signal input, an analog signal output, an analog signal path means with preselectable delay means and gain weighting means coupling said analog signal input to said analog signal output, and digital signal input means operative to preselect finite impulse response delay and gain weighting;

a sampled time comb-type signal processing means having an analog input which is coupled to said analog signal output of said finite impulse response means, said comb means further having an analog signal output, an analog signal path means with preselectable delay means and gain weighting means coupling said analog signal input to said analog signal output, and digital signal input means operative to preselect comb delay and gain weighting;

a sampled time all pass signal processing means having an analog signal input which is coupled to said analog output of said comb means, said all pass means further having an analog signal output, and an analog signal path with preselected all pass delay and gain weighting; and a summer coupled to the analog signal output of said all pass means and said finite impulse response means for propagating a discrete number of selected early reflections and a high echo density representation of reflections following said early reflections, thereby simulating acoustic reverberation of an enclosure.

2. The apparatus according to claim 1 wherein said finite impulse response means and said comb means each includes a plurality of multiplying digital-to-analog converters, each multiplying digital-to-analog converter including an analog input responsive to said analog signal input and a digital input which comprises said digital signal input means.

3. The apparatus according to claim 1 or 2 further including means responsive to input of a plurality of parameters describing the dimension of a room to be simulated for computing selected delays and gain weighting coefficients for early reflections, said computing means coupled to said digital signal input means of said finite impulse response means and of said comb means.

4. The apparatus of claim 3 wherein said delay means of said finite impulse response means and of said comb means comprises a plurality of charge transfer device-type analog signal delay lines having digital clock input means for regulating propagation of an analog signal.

5. The apparatus of claim 4 further comprising low pass filter means coupled to each one of said delay lines for recovering a continuous analog signal.

6. The apparatus of claim 5 further including programmable timer means coupled to said clock input means for selectively programming said delay lines.

7. An apparatus for simulating acoustic reverberation comprising:
   an analog transversal filter means having analog inputs and analog outputs and responsive to digital control delay and gain weighting parameters;
   analog signal processing means coupled to said outputs of said transversal filter means and responsive to digital control delay and gain weighting parameters for producing a high echo density echo transient;
   means coupled to said transversal filter means and to said analog signal processing means for computing and generating digital control parameters; and
   means coupled to said analog outputs of said transversal filter means and of said analog signal processing means for summing analog signals representative of acoustic reverberation.

8. A method for generating an electronic simulation of acoustic reverberation comprising:
   applying a direct analog signal to a sampled time finite impulse response signal processing means having a digitally programmable delay line means and gain weighting means to produce an analog output signal representative of a preselected number of early echoes;
   applying said early echoes output signal to an analog comb filter having digitally programmable delay line means and gain weighting means, the output of which is applied to an all pass section to produce a delayed analog output signal representative of a high echo density echo transient; and
   combining said direct signal, said discrete echo signal and said echo transient signal into a composite analog output signal representative of reverberation.

9. The method of claim 8 further including the steps of digitally programming the delays of said delay line means and digitally programming the gain weighting coefficients of said gain weighting means, wherein said programming steps are carried out off-line.

10. The method of claim 9 wherein said digital programming steps are carried out via a general purpose microprocessor.

11. A method for generating an electronic simulation of acoustic reverberation comprising:
   applying a direct analog signal to a sampled time finite impulse response signal processing means having a digitally programmable delay line means and gain weighting means to produce an analog output signal representative of a preselected number of early echoes;
   applying said direct analog signal to an analog comb filter having digitally programmable delay line means and gain weighting means, the output of which is applied to an all pass section to produce a delayed analog output signal representative of a high echo density echo transient; and
   combining said direct signal, said early echo signal and said echo transient signal into a composite analog output signal representative of reverberation.

12. An apparatus for generating an electronic simulation of acoustic reverberation comprising:
   a sampled time finite impulse response signal processing means having an analog signal input, an analog signal output, an analog signal path means with preselectable delay means and gain weighting means coupling said analog signal input to said analog signal output, and digital signal input means operative to preselect finite impulse response delay and gain weighting;
   a sampled time comb-type signal processing means having an analog input which is coupled to said analog signal output of said finite input response signal processing means, said comb-type signal processing means further having an analog signal output, an analog signal path means with preselectable delay means and gain weighting means coupling said analog signal input to said analog signal output, and digital signal input means operative to preselect comb delay and gain weighting;
   a sampled time all pass signal processing means having an analog signal input which is coupled to said analog output of said comb means, said all pass means further having an analog signal output, and an analog signal path with preselected all pass delay and gain weighting; and
   a summer coupled to the analog signal output of said all pass means and said finite impulse response means for propagating a discrete number of selected early reflections and a high echo density representation of reflections following said early reflections, thereby simulating acoustic reverberation of an enclosure.

* * * * *